(12) United States Patent
Chung et al.

(10) Patent No.: US 10,312,096 B2
(45) Date of Patent: Jun. 4, 2019

(54) METHODS FOR TITANIUM SILICIDE FORMATION USING TICL₄ PRECURSOR AND SILICON-CONTAINING PRECURSOR

(71) Applicant: Applied Materials, Inc., Santa Clara, CA (US)

(72) Inventors: Hua Chung, San Jose, CA (US); Matthias Bauer, Sunnyvale, CA (US); Schubert S. Chu, San Francisco, CA (US); Satheesh Kuppurao, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/832,571

(22) Filed: Dec. 5, 2017

(65) Prior Publication Data

US 2018/0166288 A1  Jun. 14, 2018

Related U.S. Application Data

(60) Provisional application No. 62/432,844, filed on Dec. 12, 2016.

(51) Int. Cl.
*H01L 21/285* (2006.01)
*H01L 29/167* (2006.01)
(Continued)

(52) U.S. Cl.
CPC ...... *H01L 21/28518* (2013.01); *H01L 21/285* (2013.01); *H01L 21/324* (2013.01); *H01L 21/32053* (2013.01); *H01L 29/167* (2013.01); *H01L 29/456* (2013.01); *H01L 29/665* (2013.01); *H01L 21/02043* (2013.01); *H01L 21/02532* (2013.01); *H01L 29/0847* (2013.01);
(Continued)

(58) Field of Classification Search
CPC ......... H01L 21/28518; H01L 21/32053; H01L 21/285; H01L 21/324; H01L 29/45; H01L 29/456; H01L 29/167
See application file for complete search history.

(56) References Cited

U.S. PATENT DOCUMENTS

| | | | |
|---|---|---|---|
| 4,766,006 A | 8/1988 | Gaczi | |
| 5,240,739 A * | 8/1993 | Doan | .......... C23C 16/42 257/E21.165 |

(Continued)

OTHER PUBLICATIONS

Du, J. et al., "Self-induced Preparation of Assembly Shrubbery TiSi Nanowires by Chemical Vapor Deposition," Crystal Growth & Design, 2008, vol. 8, No. 10, 3543-3548. (Year: 2008).*

(Continued)

*Primary Examiner* — Michael Jung
(74) *Attorney, Agent, or Firm* — Patterson + Sheridan LLP

(57) ABSTRACT

The present disclosure generally relates to methods of selectively forming titanium silicides on substrates. The methods are generally utilized in conjunction with contact structure integration schemes. In one embodiment, a titanium silicide material is selectively formed on a substrate as an interfacial layer on a source/drain region. The titanium silicide layer may be formed at a temperature within range of about 400 degrees Celsius to about 500 degrees Celsius.

20 Claims, 3 Drawing Sheets

(51) Int. Cl.
*H01L 29/45* (2006.01)
*H01L 21/3205* (2006.01)
*H01L 21/324* (2006.01)
*H01L 29/66* (2006.01)
*H01L 29/08* (2006.01)
*H01L 21/02* (2006.01)
*H01L 29/165* (2006.01)
*H01L 29/78* (2006.01)

(52) U.S. Cl.
CPC ........ *H01L 29/165* (2013.01); *H01L 29/7833* (2013.01); *H01L 29/7848* (2013.01)

(56) References Cited

U.S. PATENT DOCUMENTS

| | | | | |
|---|---|---|---|---|
| 6,010,929 | A * | 1/2000 | Chapman | H01L 21/82385 257/E21.638 |
| 6,287,967 | B1 * | 9/2001 | Hsieh | H01L 29/41783 257/E21.438 |
| 6,777,759 | B1 * | 8/2004 | Chau | H01L 21/28525 257/377 |
| 7,776,675 | B1 | 8/2010 | Gan et al. | |
| 7,868,458 | B2 | 1/2011 | Lee et al. | |
| 8,324,699 | B2 * | 12/2012 | Ichijo | C23C 16/02 257/431 |
| 2003/0042614 | A1 * | 3/2003 | Deraa | H01L 21/28518 257/768 |
| 2003/0170982 | A1 * | 9/2003 | Basceri | C23C 16/42 438/674 |
| 2004/0127027 | A1 * | 7/2004 | Lee | H01L 21/28518 438/683 |
| 2005/0009325 | A1 | 1/2005 | Chung et al. | |
| 2006/0267107 | A1 | 11/2006 | Chiu et al. | |
| 2014/0117380 | A1 * | 5/2014 | Loboda | H01L 21/30625 257/77 |
| 2014/0306250 | A1 * | 10/2014 | Gardner | H01L 25/0753 257/89 |
| 2015/0061010 | A1 * | 3/2015 | Cheng | H01L 29/0692 257/344 |
| 2015/0303051 | A1 * | 10/2015 | Takeda | H01L 21/0228 438/758 |
| 2015/0333180 | A1 | 11/2015 | Glass et al. | |
| 2017/0271501 | A1 * | 9/2017 | Avci | H01L 29/7391 |
| 2018/0083435 | A1 * | 3/2018 | Redler | H02H 3/087 |

OTHER PUBLICATIONS

PCT/US2017/064762, International Search Report dated Mar. 22, 2018, 16 pages.

Lee, Chi-Young, "Selective Formation of Titanium Silicide by Chemical Vapor Deposition Using Titanium Halides and Silicon Wafer as the Precursors", Journal of Materials Synthesis and Processing, vol. 6, No. 1, 1998, 5 total pages.

* cited by examiner

METHODS FOR TITANIUM SILICIDE FORMATION USING TICL₄ PRECURSOR AND SILICON-CONTAINING PRECURSOR

BACKGROUND

Field

Embodiments of the present disclosure generally relate to silicide formation, such as silicides used in contact integration schemes.

Description of the Related Art

Titanium silicide is a promising material for silicide contacts in semiconductor device manufacturing. However, chemical vapor deposition (CVD) of titanium silicide is not selective for temperatures below 800° C. In addition, conventional titanium silicide has less than desirable conformity, and results in consumption of silicon during silicide formation. Moreover, conventional titanium silicide formation processes are often utilized in conjunction with a post deposition anneal to form low resistivity phase silicides. The above variables are often time consuming and are not compatible with thermal budgets for advanced node contact structure integration schemes.

Therefore, improved silicide formation methods are needed.

SUMMARY

In one embodiment, a method of forming a titanium silicide layer comprises heating a substrate in a process chamber to a temperature within a range of about 400 degrees Celsius to about 500 degrees Celsius; exposing the substrate to a silicon precursor and titanium precursor concurrently while maintaining a pressure within the process chamber between about 10 torr and about 100 torr, the titanium precursor comprising $TiCl_4$; and forming a titanium silicide layer on the substrate.

In another embodiment, a method of forming a titanium silicide layer comprises heating a substrate in a process chamber to a temperature within a range of about 400 degrees Celsius to about 500 degrees Celsius, wherein the substrate includes a silicon layer having an n-type dopant within a concentration range of about $1 \times 10^{18}$ atoms/cm³ to about $4 \times 10^{21}$ atoms/cm³; exposing the substrate to a silicon precursor and titanium precursor concurrently while maintaining a pressure within the process chamber between about 80 torr and about 100 torr, the titanium precursor comprising $TiCl_4$; and forming a titanium silicide layer on the silicon layer.

In another embodiment, a method of forming a titanium silicide layer comprises heating a substrate in a process chamber to a temperature within a range of about 400 degrees Celsius to about 500 degrees Celsius, wherein the substrate includes a germanium layer thereon; exposing the substrate to a silicon precursor and titanium precursor concurrently while maintaining a pressure within the process chamber between about 80 torr and about 100 torr, the titanium precursor comprising $TiCl_4$; and forming a titanium silicide layer on the germanium layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to methods of selectively forming titanium silicides on substrates. The methods are generally utilized in conjunction with contact structure integration schemes. In one embodiment, a titanium silicide material is selectively formed on a substrate as an interfacial layer on a source/drain region. The titanium silicide layer may be formed at a temperature within range of about 400 degrees Celsius to about 500 degrees Celsius. The resulting titanium silicide exhibits desirable contact resistance and applicability in advanced contact integration schemes.

Figure 1:
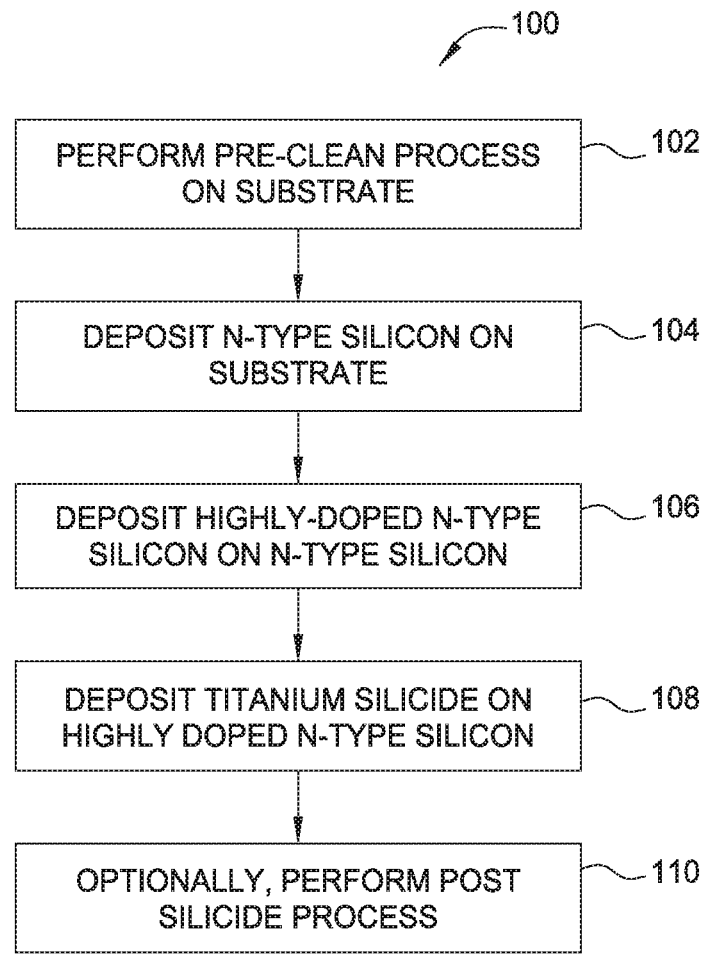
FIG. 1 illustrates operations of a method according to one embodiment of the disclosure.

FIG. 1 illustrates operations of a method 100 according to one embodiment described herein. In operation 102, a substrate is subjected a pre-clean process. The substrate is a silicon substrate, such as an n-type silicon substrate, however the substrate may alternatively be a germanium or silicon-germanium substrate. The substrate includes one or more source/drain (S/D) regions, contact trenches, or the like, formed thereon. The S/D regions are formed from an epitaxial material or include an epitaxial material deposited thereon. The S/D regions are silicon, germanium or silicon-germanium doped with a respective n-type or p-type dopant.

Epitaxial materials described herein include one or more of silicon, phosphorus-doped silicon, highly-strained phosphorus-doped silicon, germanium, phosphorus-doped germanium, silicon germanium, or phosphorus-doped silicon germanium. While embodiments herein may be described with respect to n-type dopants, such as phosphorus, it is contemplated that other dopants may be utilized, including arsenic, and antimony. P-type dopants may also be utilized, including boron, aluminum, gallium, and indium.

The pre-cleaning process removes native oxides or other contaminants from the surface of the substrate, the S/D region, and/or the epitaxial layer formed on the S/D region. Suitable pre-cleaning processes include the SICONI® pre-clean process available from Applied Materials, Santa Clara, Calif. However, it is contemplated that suitable cleaning processes from other manufacturers may also be implemented in accordance with the embodiments described herein.

After cleaning of the substrate in operation 102, an n-type silicon layer is deposited over the S/D regions in operation 104. The n-type silicon layer is deposited in a low temperature (e.g., about 400 degrees Celsius to about 500 degrees Celsius) chemical vapor deposition (CVD) process. The n-type silicon is deposited via a silicon precursor, such as silane ($SiH_4$) or higher order silanes, including $Si_2H_6$, $Si_3H_8$, and $Si_4H_{10}$. An n-type dopant, such as phosphorus dopant, for example phosphine, may be included in the process gas during the CVD process to dope the n-type silicon to a desired dopant level. One or more reducing agents, carrier gases, and the like may be also utilized. A mask and/or etch operation may be utilized to deposit the n-type silicon layer in desired regions. In operation 104, if an optional epitaxial material is present on the S/D regions, then the n-type silicon layer is deposited on the optional epitaxial material.

Subsequently, a highly-doped n-type silicon layer is deposited on the n-type silicon layer in operation 106. The highly-doped n-type silicon layer may be amorphous, crystalline, or polycrystalline silicon. The highly doped silicon layer is deposited in the same manner as the n-type silicon layer deposited in operation 104. In such an example, the n-type silicon layer is deposited using the same precursors and dopants, but is doped to a greater concentration of n-type dopant. In one example, the highly-doped n-type silicon layer is doped to a concentration of about $1 \times 10^{18}$ atoms/cm$^3$ to about $4 \times 10^{21}$ atoms/cm$^3$. The relatively higher dopant concentration facilitates growth of metal silicide films thereon, as discussed with respect to operation 108. The highly-doped n-type silicon layer may be deposited to a thickness within a range of about 1 nanometer to about 10 nanometers, such as 3 nanometers to about 7 nanometers, for example, about 5 nanometers or less.

In operation 108, a titanium silicide layer is formed on the highly-doped n-type silicon layer of operation 106. The titanium silicide layer is formed at a chamber pressure within a range of about 10 torr to about 100 torr, such as about 80 torr to about 100 torr. The temperature of the substrate may be maintained in a range of about 400 degrees Celsius to about 500 degrees Celsius during the formation of the titanium silicide layer. It is believed that the temperature and pressure ranges described herein facilitate nucleation of a titanium silicide layer. The deposition rate of the titanium silicide layer varies as a function of temperature. In one example, the growth rate of the titanium silicide layer ranges from about 3.5 angstroms at 400 degrees Celsius to about 100 angstroms per minute at 500 degrees Celsius.

The titanium silicide layer is formed in a CVD process, such as a single-deposition-step thermal CVD (e.g., plasma-free) process, using a silicon precursor and titanium precursor which are concurrently exposed to a substrate via concurrent flow into a processing chamber. In one example, the silicon precursor is silane, and is provided at a flow rate of about 10-120 sccm, such as about 100 sccm. Optionally, disilane, or a higher order silane, may be concurrently provided with the silane to facilitate silicidation. The titanium precursor is $TiCl_4$, and is provided at a flow rate within a range of about 0.1 sccm to about 1 sccm, such as about 0.2 sccm. The silicon precursor gas and the titanium precursor gas may be coflowed with a carrier gas, such as hydrogen, at a flow rate of 10 sccm to about 100 sccm, such as about 20 sccm.

In one example, a titanium silicide layer grown according to the processes described herein has a composition of about $Si_{0.95}Ti_{0.05}$. The titanium silicide layer of another an example has a resistivity of 25 micro-Ohm/cm or less, such as 20 micro-Ohm/cm or less. Additionally, the titanium silicide layers grown according to the process above exhibit selectively against oxides and nitrides, such as silicon oxide, silicon nitride, and silicon oxycarbide.

Optionally, in operation 110, one or more post silicidation processes may be performed. Post silicidation processes may include additional process for completion of device processing. Example processes include passivation of the titanium silicide layer. Passivation may include exposure of the titanium silicide layer to nitrogen plasma, or deposition of a titanium nitride layer over the titanium silicide layer. Additionally post silicidation processes include dynamic surface anneals, metal plug formation (e.g., tungsten or cobalt plug), and the like.

While FIG. 1 illustrates one embodiment, other embodiments are also contemplated. In another embodiment, it is contemplated that operation 104 may be excluded. In another example, the highly-doped n-type silicon layer (formed in operation 106) may optionally be replaced with a germanium layer or a highly-doped n-type germanium layer. In another example, the highly-doped n-type silicon layer may additionally or alternatively include titanium as a dopant. In such an example, $TiCl_4$ may be coflowed with other precursors (such as a silicon precursor and optionally an n-type dopant). The $TiCl_4$ may be provided at a flow rate of about 0.1 sccm to about 1 sccm, such as about 0.2 sccm. The inclusion of titanium facilitates nucleation of the titanium silicide layer formed in operation 108.

In another embodiment, an optional $TiCl_4$ soak may be performed between operations 106 and 108 to facilitate nucleation of the titanium silicide layer formed in operation 108. The $TiCl_4$ soak may be performed at a pressure of about 80 torr to about 100 torr and at a temperature of about 450 degrees Celsius to about 600 degrees Celsius. $TiCl_4$ may be introduced to a process chamber at a flow rate of 50 sccm to about 100 sccm for about 15 seconds to about 120 seconds, such as about 30 seconds to 90 seconds.

In one example, a titanium silicide layer is grown according to embodiments described herein. The titanium silicide layer is formed on a germanium film. The resultant film forms in the C49 phase, and exhibits a resistivity of about 90 micro-Ohm/cm. In another embodiment, a titanium silicide layer is grown on a crystalline silicon layer doped with phosphorus within a range of about $1 \times 10^{18}$ atoms/cm$^3$ to about $4 \times 10^{21}$ atoms/cm$^3$. The resultant film is formed in the C49 phase, and exhibits a resistivity of about 140 micro-Ohm/cm.

In another embodiment, a titanium silicide layer is grown on an amorphous silicon layer doped with phosphorus within a range of about $1 \times 10^{18}$ atoms/cm$^3$ to about $4 \times 10^{21}$ atoms/cm$^3$. The resultant film is formed in the C49 phase, and exhibits a resistivity of about 60 micro-Ohm/cm. In another embodiment, a titanium silicide layer is grown on a silicon layer exposed to a $TiCl_4$ bath, or a silicon layer which is deposited in the presence of $TiCl_4$. The resultant film is formed in the C54 phase, and has a resistivity of about 25 micro-Ohm/cm or less.

Aspects herein describe various flow rates for particular applications. It is to be noted that the provided flow rates are for 300 millimeter (mm) substrates, such as 300 mm semiconductor wafers. Other flow rates for both similarly sized and differently sized substrates are contemplated.

Figure 2A:
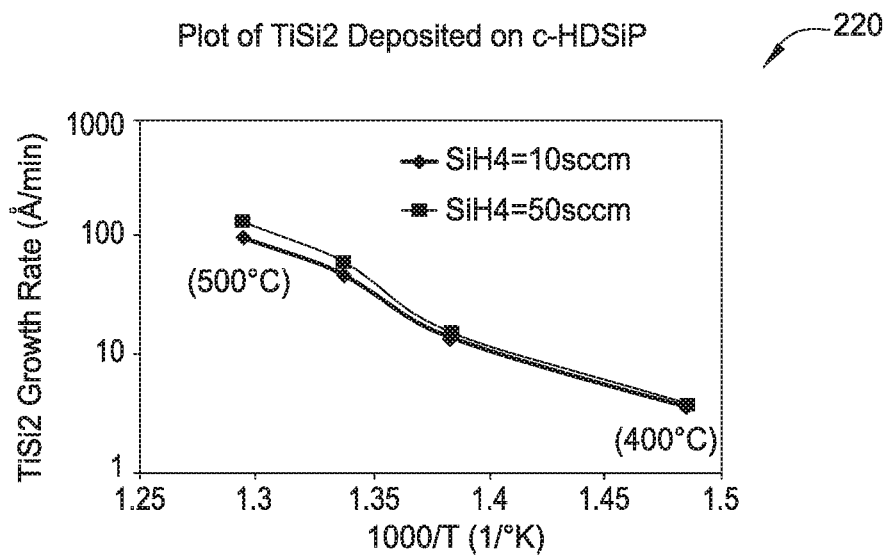
FIGS. 2A and 2B illustrate titanium silicide films under various conditions, according to embodiments of the disclosure.
Figure 2B:
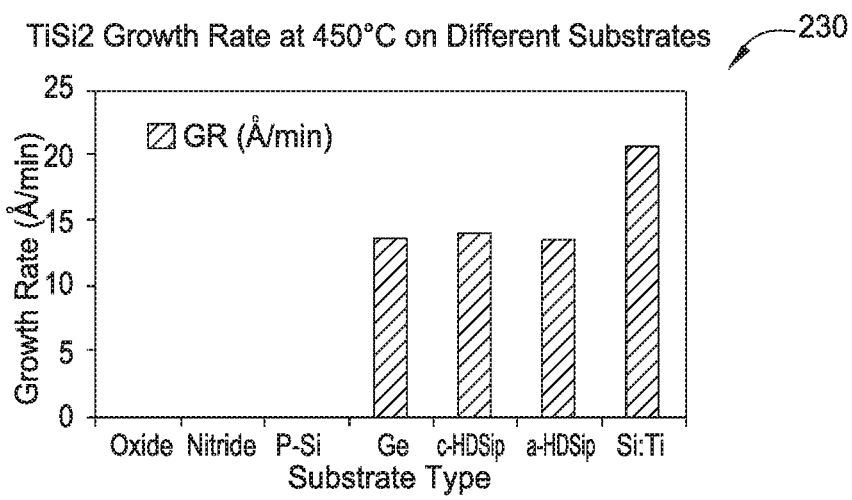

FIGS. 2A and 2B illustrate titanium silicide films under various conditions, according to embodiments of the disclosure. FIG. 2A illustrates a graph 220 of the growth rate of titanium silicide at different temperatures for silane flow rates of 10 sccm and 50 sccm. As illustrated, the growth rate of titanium silicide is influenced more by temperature than by flow rate.

FIG. 2B illustrates a graph 230 of the growth rate of titanium silicide on various substrates. As illustrated in FIG.

2B, titanium silicide grows on germanium, crystalline highly-doped SiP (e.g., phosphorus concentration of about $1\times10^{18}$ atoms/cm$^3$ to about $4\times10^{21}$ atoms/cm$^3$), amorphous highly-doped SiP, and titanium-doped or TiCl$_4$-soaked silicon. In contrast, titanium silicide of the present disclosure does not appreciably grow (e.g., is selective against) on oxides, nitrides, or silicon having a phosphorus concentration less than about $1\times10^{18}$ atoms/cm$^3$.

Figure 3:
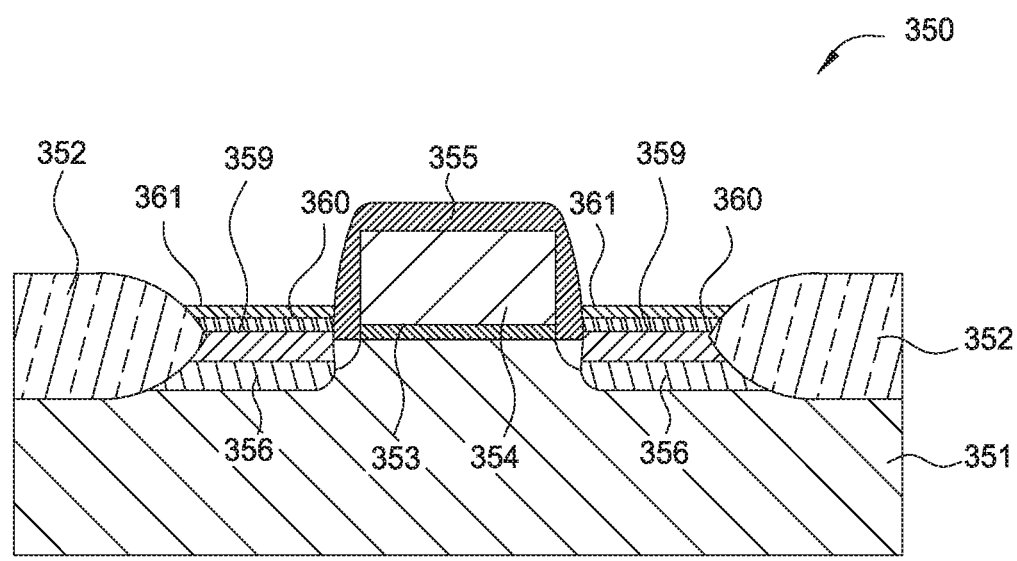
FIG. 3 illustrates a device formed according to one embodiment of the disclosure.

FIG. 3 illustrates a device 350 formed according to one embodiment of the disclosure. The device 350 includes a substrate 351 having S/D regions 356 formed thereon. Field oxide layers 352 are formed adjacent the S/D regions 356 to define the S/D regions 356. A gate insulation layer 353 and a gate electrode 354 are disposed over the substrate 351. An insulation layer 355 is disposed over the upper surface and lateral sides of the gate electrode 354.

The device also includes one or more first n-type silicon layers 359 (deposited in operation 104), one or more highly-doped n-type silicon layers 360 (deposited in operation 106), and titanium silicide layers 361 (formed in operation 108). It is contemplated that other devices and other layer stacks may be utilized or formed according to embodiments described herein.

Benefits of the disclosure include titanium silicide methods that are formed at lower temperatures than conventional techniques, thus mitigating thermal budget issues common in conventional silicide formation operations. Additionally, aspects described herein form titanium silicide layers at reduced incubation times compared to conventional approaches. Moreover, titanium silicide layers formed according to aspects herein are selective against oxide and nitride layers, thereby reducing masking/etching operations used in conventional approaches.

While the foregoing is directed to embodiments of the present disclosure, other and further embodiments of the disclosure may be devised without departing from the basic scope thereof, and the scope thereof is determined by the claims that follow.

What is claimed is:

1. A method of forming a titanium silicide layer, comprising:
   heating a substrate in a process chamber to a temperature within a range of 400 degrees Celsius to 500 degrees Celsius, the substrate comprising:
      one or more source/drain regions;
      one or more first n-type silicon layers disposed on the one or more source/drain regions; and
      one or more highly-doped n-type silicon layers disposed on the one or more first n-type silicon layers, each of the one or more highly-doped n-type silicon layers having an n-type dopant concentration within a range of $1\times10^{18}$ atoms/cm$^3$ to $4\times10^{21}$ atoms/cm$^3$; and
   exposing the substrate to a silicon precursor and titanium precursor concurrently while maintaining a pressure within the process chamber between 10 Torr and 100 Torr, the titanium precursor comprising TiCl$_4$; and
   forming a titanium silicide layer on the one or more highly-doped n-type silicon layers.

2. The method of claim 1, wherein the n-type dopant is phosphorus.

3. The method of claim 2, wherein at least one of the one or more highly-doped n-type silicon layers comprises amorphous silicon.

4. The method of claim 2, wherein at least one of the one or more highly-doped n-type silicon layers comprises crystalline silicon.

5. The method of claim 1, wherein the n-type dopant is arsenic or antimony.

6. The method of claim 1, wherein at least one of the one or more highly-doped n-type silicon layers comprises titanium.

7. The method of claim 1, wherein the pressure within the process chamber is within a range of 80 Torr to 100 Torr.

8. The method of claim 1, wherein at least one of the one or more highly-doped n-type silicon layers has a thickness of 1 nanometer to 10 nanometers.

9. The method of claim 1, wherein at least one of the one or more highly-doped n-type silicon layers has a thickness of 5 nanometers or less.

10. The method of claim 1, further comprising exposing the substrate to a TiCl$_4$ soak prior to forming the titanium silicide layer.

11. The method of claim 10, wherein the TiCl$_4$ soak is performed for 15 seconds to 120 seconds.

12. The method of claim 1, wherein the titanium silicide layer is C49 phase.

13. The method of claim 1, wherein the titanium silicide layer is C54 phase.

14. The method of claim 1, wherein the one or more highly-doped n-type silicon layers comprises germanium.

15. The method of claim 1, wherein the substrate further comprises field oxide layers, and formation of the titanium silicide is selective against the field oxide layers.

16. The method of claim 1, wherein at least one of the one or more highly-doped n-type silicon layers have a higher dopant concentration than each of the one or more first n-type silicon layers.

17. A method of forming a titanium silicide layer, comprising:
   heating a substrate in a process chamber to a temperature within a range of 400 degrees Celsius to 500 degrees Celsius, the substrate comprising:
      one or more first n-type silicon layers; and
      one or more highly-doped n-type silicon layers disposed over the one or more first n-type silicon layers, the one or more highly-doped n-type silicon layers having an n-type dopant concentration within a range of $1\times10^{18}$ atoms/cm$^3$ to $4\times10^{21}$ atoms/cm$^3$;
   exposing the substrate to a silicon precursor and titanium precursor concurrently while maintaining a pressure within the process chamber between 80 Torr and 100 Torr, the titanium precursor comprising TiCl$_4$; and
   forming a titanium silicide layer on the one or more highly-doped n-type silicon layers.

18. The method of claim 17, wherein at least one of the one or more highly-doped n-type silicon layers have a higher dopant concentration than each of the one or more first n-type silicon layers.

19. The method of claim 17, wherein at least one of the one or more highly-doped n-type silicon layers has a thickness within a range of 1 nanometer to 10 nanometers.

20. The method of claim 19, wherein the n-type dopant is phosphorus.

* * * * *